United States Patent
Ishibashi et al.

(10) Patent No.: US 9,565,760 B2
(45) Date of Patent: Feb. 7, 2017

(54) WIRING BOARD AND METHOD OF MANUFACTURING THE SAME

(71) Applicant: KYOCERA SLC Technologies Corporation, Yasu-shi, Shiga (JP)

(72) Inventors: Hirofumi Ishibashi, Satsumasendai (JP); Masanori Tada, Satsumasendai (JP)

(73) Assignee: KYOCERA CORPORATION, Kyoto-Shi, Kyoto (JP)

(*) Notice: Subject to any disclaimer, the term of this patent is extended or adjusted under 35 U.S.C. 154(b) by 439 days.

(21) Appl. No.: 14/311,451

(22) Filed: Jun. 23, 2014

(65) Prior Publication Data
US 2015/0000968 A1    Jan. 1, 2015

(30) Foreign Application Priority Data
Jun. 28, 2013 (JP) ................. 2013-135870

(51) Int. Cl.
| | |
|---|---|
| *H05K 1/03* | (2006.01) |
| *H05K 1/09* | (2006.01) |
| *H05K 1/00* | (2006.01) |
| *H05K 1/11* | (2006.01) |
| *H05K 7/10* | (2006.01) |
| *H05K 7/00* | (2006.01) |
| *H05K 3/34* | (2006.01) |

(52) U.S. Cl.
CPC ............ *H05K 1/111* (2013.01); *H05K 3/3452* (2013.01); *H01L 2224/16225* (2013.01); *H01L 2224/32225* (2013.01); *H01L 2224/73204* (2013.01); *H01L 2224/83192* (2013.01); *H05K 3/3436* (2013.01); *H05K 2201/0209* (2013.01); *Y02P 70/611* (2015.11)

(58) Field of Classification Search
CPC ............... H05K 3/3452; H05K 2201/0209; H05K 1/111
USPC ......... 174/256, 257, 258, 261; 361/767, 777
See application file for complete search history.

(56) References Cited

U.S. PATENT DOCUMENTS

| | | | | |
|---|---|---|---|---|
| 6,228,466 | B1* | 5/2001 | Tsukada | H01L 23/49816 174/255 |
| 2009/0027864 | A1* | 1/2009 | Cho | H05K 3/3452 361/767 |
| 2009/0218122 | A1* | 9/2009 | Fukase | H05K 3/28 174/261 |

(Continued)

FOREIGN PATENT DOCUMENTS

JP         08139438 A      5/1996

*Primary Examiner* — Sherman Ng
(74) *Attorney, Agent, or Firm* — Volpe and Koenig, P.C.

(57) ABSTRACT

In a wiring board, on an insulating layer of an outermost layer, there are provided a plurality of strip-shaped wiring conductors which are partially provided with semiconductor element connection pads to which electrode terminals of a semiconductor element are connected, at positions which prevent the semiconductor element connection pads adjacent to each other from being laterally arranged, and a solder resist layer having openings for individually exposing the semiconductor element connection pads is adhered on the insulating board as the outermost layer and on the strip-shaped wiring conductors, wherein the solder resist layer internally contains an insulating filler, and the insulating filler is sunk below the upper surfaces of the strip-shaped wiring conductors.

14 Claims, 12 Drawing Sheets

(56) References Cited

U.S. PATENT DOCUMENTS

| | | | | |
|---|---|---|---|---|
| 2009/0296364 A1* | 12/2009 | Yamamoto | ............ | H01L 21/563 361/820 |
| 2012/0161311 A1* | 6/2012 | Miyasaka | ......... | H01L 23/49822 257/734 |
| 2012/0301824 A1* | 11/2012 | Yoshida | ................ | G03F 7/0047 430/270.1 |

* cited by examiner

WIRING BOARD AND METHOD OF MANUFACTURING THE SAME

BACKGROUND OF THE INVENTION (1) Field of the Invention

The present invention relates to a wiring board for mounting a semiconductor element thereon, and a method for manufacturing the same.

(2) Description of the Related Art

Figure 8A:
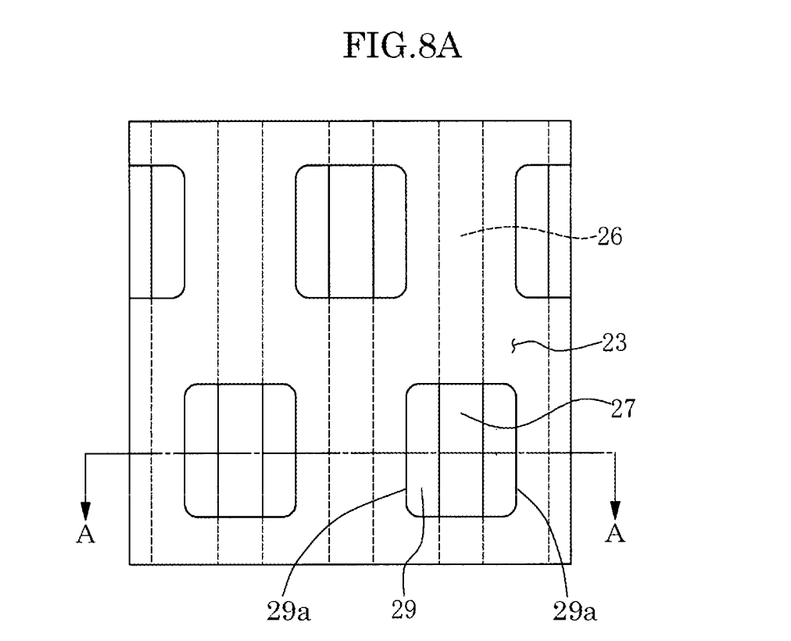
FIG. 8A is a main-part enlarged top view of a conventional wiring board.
Figure 8B:
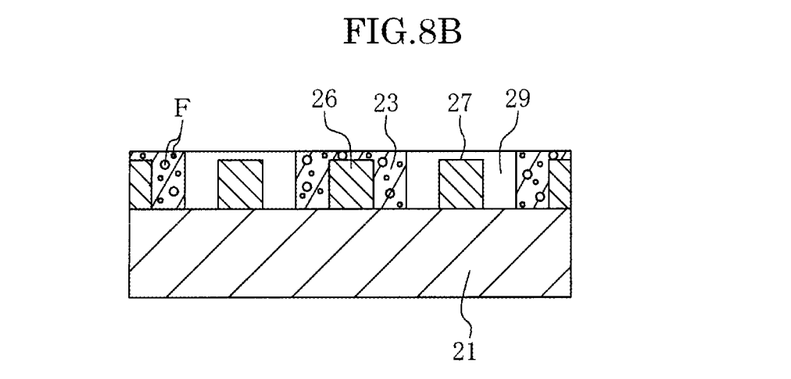
FIG. 8B is a cross-sectional view of the conventional wiring board, taken along the cut line AA in FIG. 8A.
Figure 9:
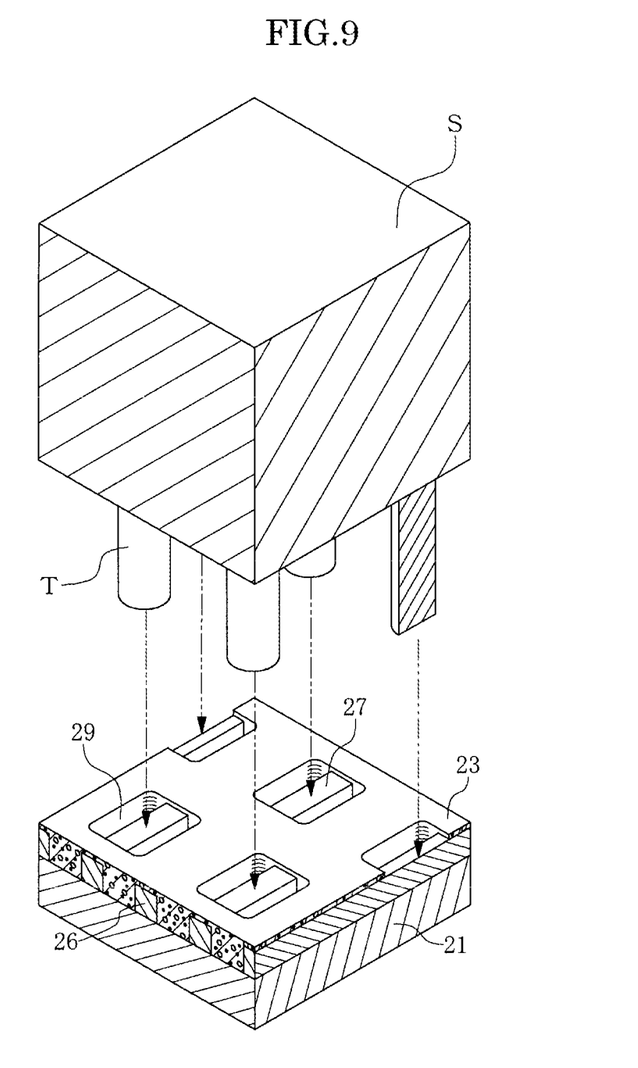
FIG. 9 is a main-part enlarged perspective view illustrating the position where a semiconductor element is to be mounted, on the conventional wiring board.

Conventionally, there have been known wiring boards for mounting, thereon, semiconductor elements having electrode terminals placed peripherally on the outer peripheral portions of their lower surfaces, through flip-chip connections. FIGS. 8A, 8B and 9 illustrate main portions of such a wiring board. As illustrated in FIGS. 8A, 8B and 9, the wiring board includes a solder resist layer 23 and a plurality of strip-shaped wiring conductors 26 for connecting a semiconductor element thereto, on an insulating layer 21. The strip-shaped wiring conductors 26 have respective thicknesses of about 10 to 20 micrometers and respective widths of about 10 to 20 micrometers. The strip-shaped wiring conductors 26 adjacent to each other are arranged at intervals of about 10 to 30 micrometers. Each strip-shaped wiring conductor 26 is partially provided with a semiconductor element connection pad 27. The respective semiconductor element connection pads 27 are placed in a zigzag manner, in order to prevent the strip-shaped wiring conductors 26 adjacent to each other from being arranged laterally. The solder resist layer 23 has openings 29 for individually exposing the semiconductor element connection pads 27. The solder resist layer 23 covers the remaining portions of the strip-shaped wiring conductors 26 which are other than the portions of the semiconductor element connection pads 27. Further, each of the openings 29 has opening edges 29a between the corresponding semiconductor element connection pad 27 and the strip-shaped wiring conductors 26 adjacent thereto.

Electrode terminals T of the semiconductor element S are brought into contact with the semiconductor element connection pads 27 and, further, both of them are bonded to each other through a conductive bonding material such as a solder, for example. Thus, the electrode terminals T of the semiconductor element S are electrically connected to the strip-shaped wiring conductors 26.

After the electrode terminals T of the semiconductor element S have been bonded to the semiconductor element connection pads 27, the gap between the lower surface of the semiconductor element S and the upper surface of the solder resist layer 23 is filled with a sealing resin, which is called an under filling, in order to protect the semiconductor element S.

As a method for forming the solder resist layer 23 in such a wiring board, there has been known a method as disclosed in Japanese Unexamined Patent Application Publication No. 8-139438.

Figure 10A:
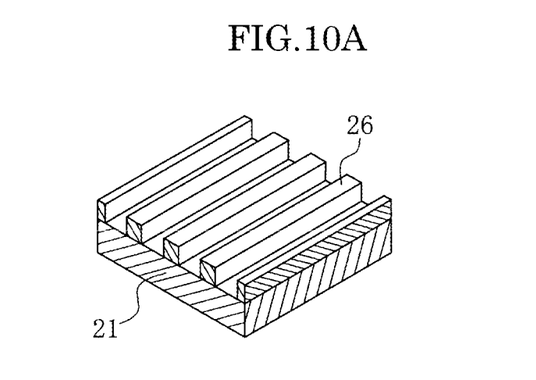
FIGS. 10A to 10E are schematic main-part enlarged perspective views of respective steps, for explaining a method for manufacturing the conventional wiring board.
Figure 10B:
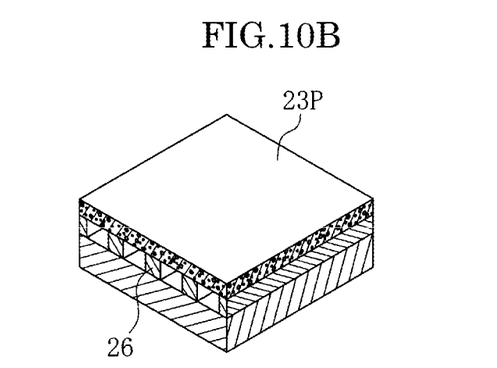

At first, the strip-shaped wiring conductors 26 are formed on the upper surface of the insulating layer 21, as illustrated in FIG. 10A. Next, as illustrated in FIG. 10B, a photosensitive resin film 23P for the solder resist layer 23 is placed on the strip-shaped wiring conductors 26.

Figure 10C:
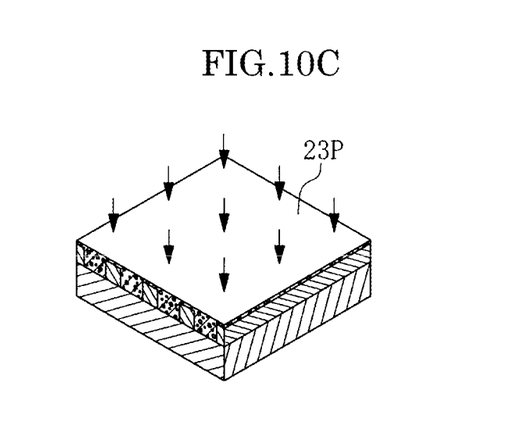

Next, as illustrated in FIG. 10C, hot pressing is performed on the photosensitive resin film 23P, in the direction of arrows, with a flat pressing plate, which is not illustrated, so that the photosensitive resin film 23P is softened and is partially pushed into the intervals between the strip-shaped wiring conductors 26, 26 adjacent to each other. At this time, the upper surface of the photosensitive resin film 23P which has been subjected to the hot pressing is maintained at a flattened state.

Figure 10D:
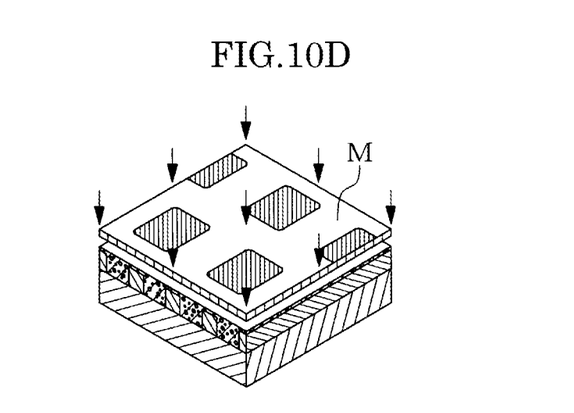

Next, as illustrated in FIG. 10D, a light-exposure mask M having a light-shield pattern is placed on the photosensitive resin film 23P, at the portions corresponding to the openings 29. Subsequently, an UV ray as exposure light is directed to the photosensitive resin film 23P from above the light-exposure mask M, in the direction of arrows, for performing light exposure thereon.

Figure 10E:
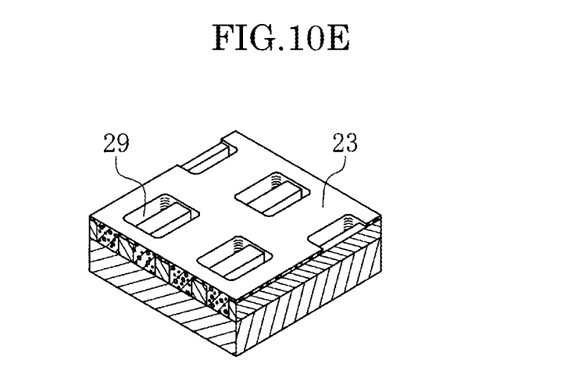

At last, as illustrated in FIG. 10E, the portions of the photosensitive resin film 23P which have not been subjected to the light exposure are removed, through development. Subsequently, the photosensitive resin film 23P which has been left is thermally cured, thereby forming the solder resist layer 23.

On the other hand, in the wiring board including the solder resist layer 23 having the openings 29 for individually exposing the semiconductor element connection pads 27, if the solder resist layer 23 on the strip-shaped wiring conductors 26 has a larger thickness, this makes it harder to connect the semiconductor element connection pads 27 to the electrode terminals T of the semiconductor element S. Further, the gap between the lower surface of the semiconductor element S and the upper surface of the solder resist layer 23 is made smaller, which makes it harder to preferably fill this gap with the under filling. Therefore, in this wiring board, the solder resist layer 23 on the strip-shaped wiring conductors 26 is formed to have a smaller thickness, namely a thickness of about 3 to 10 micrometers.

Figure 11:
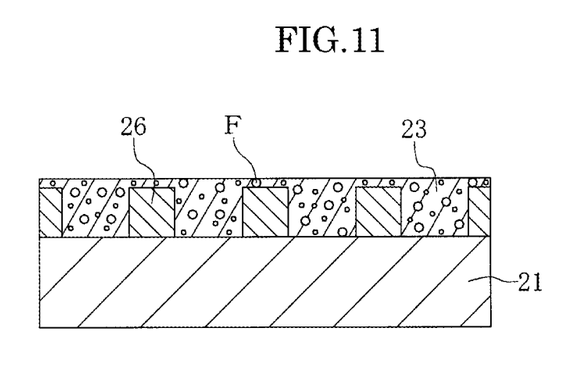
FIG. 11 is a main-part enlarged cross-sectional view for explaining the method for manufacturing the conventional wiring board.

However, as illustrated in FIG. 11, the solder resist layer 23 contains an insulating filler F with a diameter of about 1 to 10 micrometers which is made of a silicon oxide powder, for example. If this insulating filler F contains particles with diameters larger than the thickness of the solder resist layer 23 on the strip-shaped wiring conductors 26, external water and the like may reach the strip-shaped wiring conductors 26 through the contact interfaces between the insulating filler F and the resin in the solder resist layer 23. This has resulted in corrosions and discolorations in the strip-shaped wiring conductors 26, in some cases. Such corrosions and discolorations have caused degradation of electric connection reliability of the strip-shaped wiring conductors 26.

SUMMARY OF THE INVENTION

It is an object of the present invention to effectively prevent external water and the like from reaching strip-shaped wiring conductors through interfaces between the resin in a solder resist layer and an insulating filler contained in the solder resist layer even when the solder resist layer on the strip-shaped wiring conductors has a smaller thickness, thereby providing a wiring board with excellent electric connection reliability which is capable of preventing the occurrence of corrosions and discolorations in the strip-shaped wiring conductors.

In a wiring board according to the present invention, on an insulating layer of an outermost layer in an insulating board, there are provided a plurality of strip-shaped wiring conductors which are partially provided with semiconductor element connection pads to which electrode terminals of a semiconductor element are connected, at positions which prevent the semiconductor element connection pads adjacent to each other from being laterally arranged, and, also, on the insulating layer of the outermost layer and on the strip-shaped wiring conductors, there is adhered a solder resist layer which has openings for individually exposing the semiconductor element connection pads such that each of the openings has opening edges which are positioned between the corresponding semiconductor element connection pad and the strip-shaped wiring conductors adjacent to this pad, wherein the solder resist layer internally contains an insulating filler, and the insulating filler is sunk below an upper surface of the strip-shaped wiring conductors.

A wiring board manufacturing method according to the present invention includes the steps of: providing a plurality of strip-shaped wiring conductors which are partially provided with semiconductor element connection pads, on an insulating layer of an outermost layer in an insulating board, in such a way as to prevent the semiconductor element connection pads adjacent to each other from being laterally arranged; overlaying a photosensitive resin paste containing an insulating filler, on the insulating layer of the outermost layer and on a surface of the strip-shaped wiring conductors; causing the insulating filler in the photosensitive resin paste to sink below an upper surface of the strip-shaped wiring conductors; and drying the photosensitive resin paste and subsequently performing light exposure and development processing thereon to form a solder resist layer which has openings for individually exposing the semiconductor element connection pads, such that each of the openings has opening edges which are positioned between the corresponding semiconductor element connection pad and the strip-shaped wiring conductors adjacent to this pad.

With the wiring board according to the present invention, the insulating filler contained in the solder resist layer has sunk below the upper surfaces of the strip-shaped wiring conductors. Therefore, even when the solder resist layer on the strip-shaped wiring conductors has a thickness of 10 micrometers or less, namely a smaller thickness, external water and the like are prevented from reaching the strip-shaped wiring conductors through the interfaces between the resin in the solder resist layer and the insulating filler contained in the solder resist layer. This enables provision of a wiring board with excellent electric connection reliability which is capable of preventing the occurrence of corrosions and discolorations in the strip-shaped wiring conductors.

With the wiring board manufacturing method according to the present invention, the photosensitive resin paste for the solder resist is overlaid on the insulating layer of the outermost layer and on the strip-shaped wiring conductors, thereafter the insulating filler in the photosensitive resin paste is sunk below the upper surfaces of the strip-shaped wiring conductors, thereafter the photosensitive resin paste is dried and is subjected to light exposure and development processing to form the solder resist layer having the openings for individually exposing the semiconductor element connection pads. Thus, even when the solder resist layer on the strip-shaped wiring conductors has a thickness of 10 micrometers or less, namely a smaller thickness, external water and the like are prevented from reaching the strip-shaped wiring conductors through the interfaces between the resin in the solder resist layer and the insulating filler contained in the solder resist layer. This enables provision of a wiring board with excellent electric connection reliability which is capable of preventing the occurrence of corrosions and discolorations in the strip-shaped wiring conductors.

DESCRIPTION OF THE PREFERRED EMBODIMENT

Figure 1A:
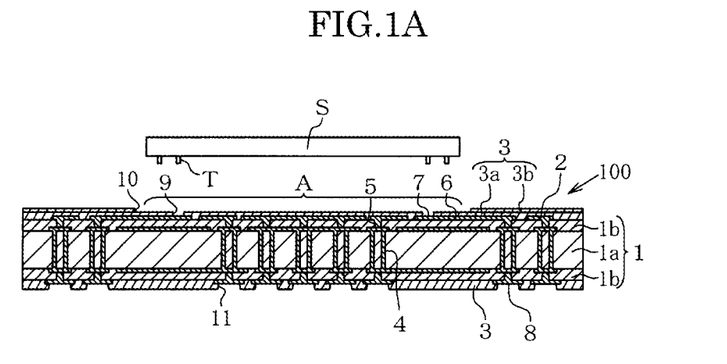
FIG. 1A is a schematic cross-sectional view of a wiring board according to an embodiment of the present invention.
Figure 1B:
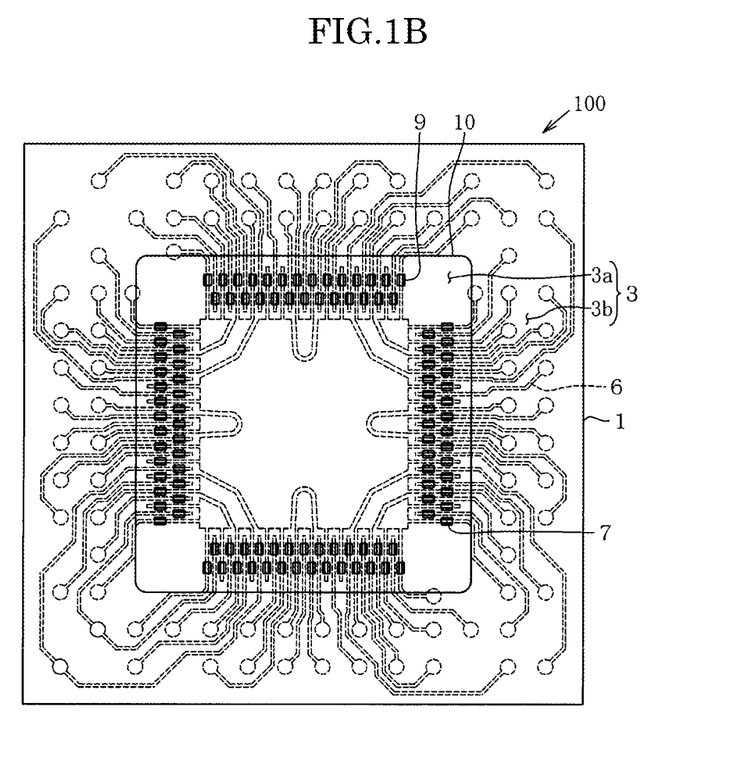
FIG. 1B is a schematic top view of the wiring board illustrated in FIG. 1A.

A wiring board according to the present invention will be described, with reference to FIGS. 1A to 7. FIGS. 1A and 1B illustrate a wiring board 100 according to an embodiment of the present invention. The wiring board 100 is constituted mainly by an insulating board 1, wiring conductors 2, and solder resist layers 3. The wiring board 100 has an upper surface which forms, at its center portion, a mounting portion A on which a semiconductor element S is to be mounted. In FIG. 1B, broken lines illustrate the portions of the wiring conductor 2 placed on the upper surface of the insulating board 1 which are covered with the solder resist layer 3.

The insulating board 1 is constituted by a core insulating layer 1a, and build-up insulating layers 1b which are laminated on the upper and lower surfaces of the core insulating layer 1a.

The core insulating layer 1a is formed from an electrically-insulating material which is made of a glass cloth base material impregnated with a thermosetting resin, such as an epoxy resin, and a bismaleimide-triazine resin, for example. The insulating layer 1a has a thickness of about 30 to 200 micrometers. The insulating layer 1a is provided with a plurality of through holes 4 extending from its upper surface to its lower surface. The through holes 4 have diameters of about 50 to 250 micrometers. The wiring conductors 2 are partially adhered to the upper and lower surfaces of the insulating layer 1a, and to the inner walls of the through holes 4.

The build-up insulating layers 1b are formed from an electrically-insulating material which is made of a thermosetting resin such as an epoxy resin, and an inorganic insulating filler such as a silicon oxide which is dispersed in the thermosetting resin. The insulating layers 1b have a thickness of about 10 to 50 micrometers. The insulating layers 1b are provided with a plurality of via holes 5 extending from their upper surfaces to their lower surfaces. The via holes 5 have diameters of about 30 to 100 micrometers. The wiring conductors 2 are partially adhered to the surfaces of the insulating layers 1b, and to the insides of the via holes 5.

The wiring conductors 2 are formed from materials with excellent conductivity, such as copper foils and copper-plated layers. The wiring conductors 2 are drawn to the lower surface of the insulating board 1 from the upper surface of the insulating board 1, through the via holes 5 and the through holes 4. The wiring conductors 2 have thicknesses of about 10 to 20 micrometers.

The wiring conductors 2 on the upper surface and the lower surface of the insulating layer 1a are formed from a copper foil and a copper-plated layer thereon and are formed to have predetermined patterns through a well-known subtractive method.

The wiring conductors 2 within the through holes 4 are formed from a copper-plated layer and are adhered to the entire surfaces of the inner walls of the through holes 4. The insides of the through holes 4 to which the wiring conductors 2 are adhered are filled with a thermosetting resin.

The wiring conductors 2 on the surfaces of the insulating layers 1b and within the via holes 5 are formed from a copper-plated layer and are formed to have predetermined patterns through a well-known semi-additive method.

Figure 2A:
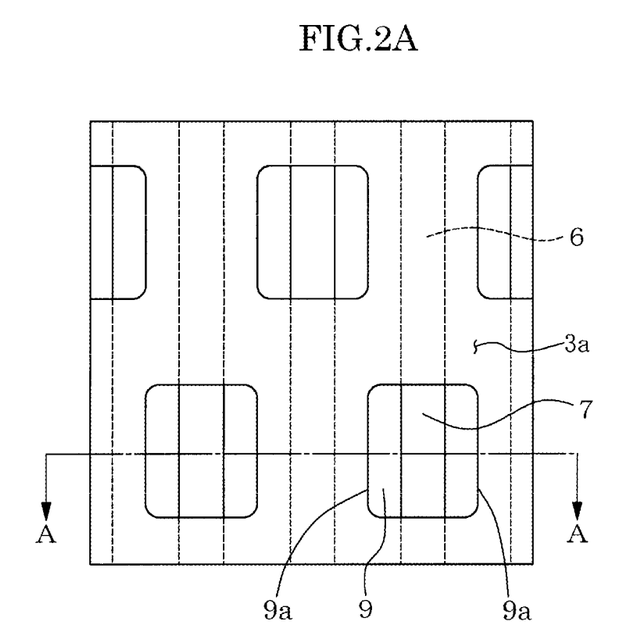
FIG. 2A is a main-part enlarged top view of the wiring board illustrated in FIGS. 1A and 1B.

The wiring conductor 2 adhered to the upper surface of the insulating board 1 partially forms a plurality of strip-shaped wiring conductors 6 for electrically connecting the semiconductor element S to an external electric circuit board which will be described later. The strip-shaped wiring conductors 6 are arranged in such a way as to extend from the center portion side of the mounting portion A to the outer peripheral side of the mounting portion A, and in such a way as to cross the respective outer peripheral sides of the mounting portion A in the directions orthogonal thereto. The strip-shaped wiring conductors 6 have respective thicknesses of about 10 to 20 micrometers and respective widths of about 10 to 20 micrometers. The strip-shaped wiring conductors 6 adjacent to each other are arranged at intervals of about 10 to 30 micrometers, in the portions where the strip-shaped wiring conductors 6 cross the respective outer peripheral sides of the mounting portion A. Each strip-shaped wiring conductor 6 is provided with a semiconductor element connection pad 7 for connecting to an electrode terminal T of the semiconductor element S, in an outer peripheral portion of the mounting portion A. The semiconductor element connection pads 7 have the same thickness and the same width as those of the strip-shaped wiring conductors 6. The semiconductor element connection pads 7 are placed in a zigzag manner, in order to prevent the strip-shaped wiring conductors 6 adjacent to each other from being arranged laterally (in order to prevent the straight lines connecting the adjacent strip-shaped wiring conductors 6 to each other from being parallel to the outer peripheral sides of the wiring board 100). The semiconductor element connection pads 7 have a length of about 20 to 60 micrometers.

The wiring conductor 2 adhered to the lower surface of the insulating board 1 partially forms external connection pads 8 for connecting the wiring board 100 to the external electric circuit board. The external connection pads 8 have a circular shape with a diameter of about 200 to 1000 micrometers. The external connection pads 8 are placed on the lower surface of the insulating board 1, in such a way as to be arranged in a lattice manner.

The solder resist layers 3 are formed from an electrically-insulating material made of a photosensitive thermosetting resin such as an acrylic-modified epoxy resin, and an inorganic insulating filler such as a silicon oxide which is dispersed in the photosensitive thermosetting resin. The respective solder resist layers 3 are adhered to the upper surface and the lower surface of the insulating board 1. In the wiring board 100, the solder resist layer 3 adhered to the upper-surface side of the insulating board 1 is constituted by two layers, which are a first solder resist layer 3a adhered directly to the insulating board 1 and the wiring conductors 2, and a second solder resist layer 3b adhered on the first solder resist layer 3a.

Figure 2B:
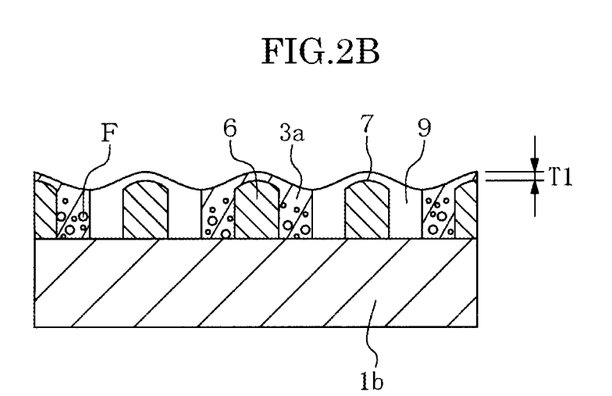
FIG. 2B is a cross-sectional view of the wiring board illustrated in FIG. 1A and 1B, taken along the cut line AA in FIG. 2A.

In the solder resist layer 3 adhered to the upper-surface side of the insulating board 1, the first solder resist layer 3a has a thickness T1 of about 3 to 10 micrometers on the strip-shaped wiring conductors 6. The first solder resist layer 3a has openings 9 for individually exposing the respective semiconductor element connection pads 7. Each opening 9 has its opening edges 9a between the corresponding semiconductor element connection pad 7 and the strip-shaped wiring conductors 6 adjacent to this semiconductor element connection pads 7. The electrode terminals T of the semiconductor element S are brought into contact with the semiconductor element connection pads 7. Subsequently, both of them are bonded to each other through a conductive bonding material such as a solder, for example. Thus, the electrode terminals T of the semiconductor element S are electrically connected to the strip-shaped wiring conductors 6.

The second solder resist layer 3b adhered on the first solder resist layer 3a has an opening 10 which surrounds the mounting portion A. When a sealing resin is injected between the semiconductor element S and the wiring board 100, after the semiconductor element S has been mounted on the mounting portion A, the second solder resist layer 3b functions as a dam for preventing the sealing resin from flowing to the outer peripheral portion of the wiring board 100.

The solder resist layer 3 adhered to the lower-surface side of the insulating board 1 has openings 11 for exposing the respective external connection pads 8. Further, the external connection pads 8 exposed through the openings 11 are bonded to wiring conductors on the external electric circuit board, through a conductive bonding material such as a solder. Thus, the semiconductor element S mounted on the wiring board 100 is electrically connected to the external electric circuit board.

Figure 3:
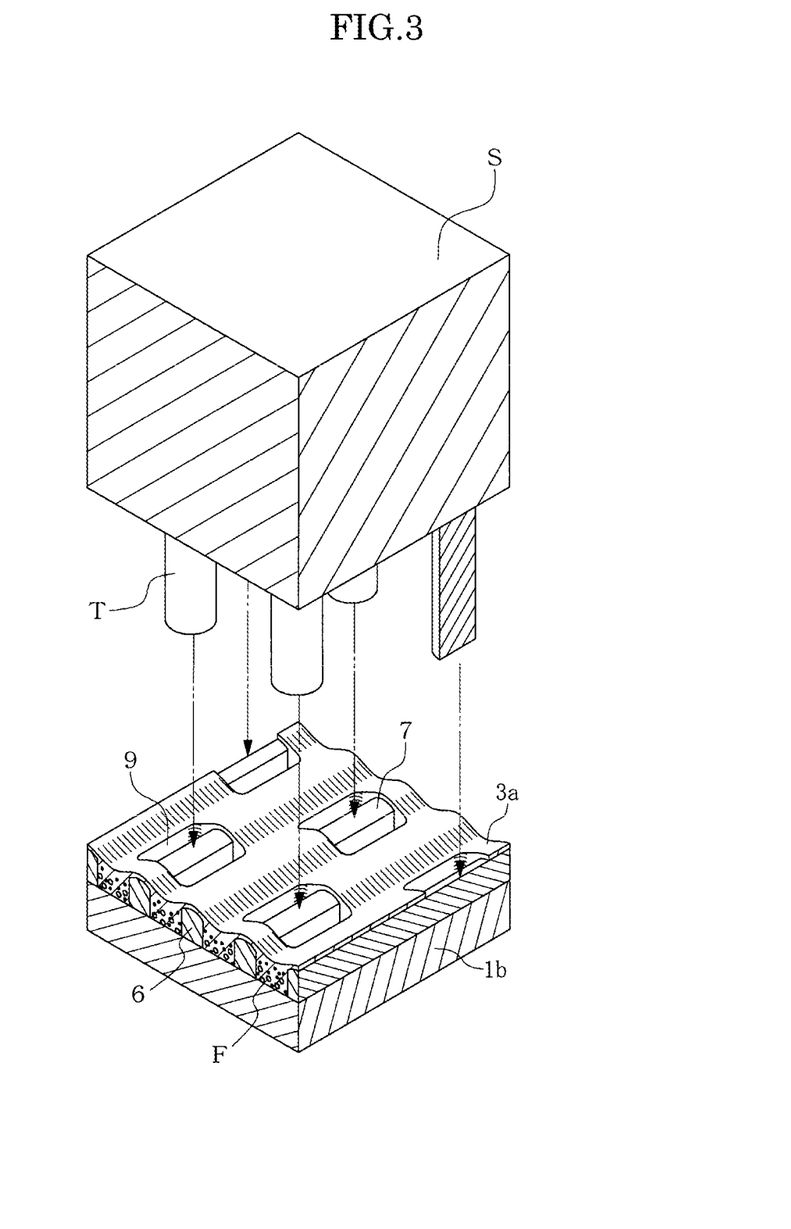
FIG. 3 is a main-part enlarged perspective view illustrating a position where a semiconductor element is to be mounted, on the wiring board illustrated in FIGS. 1A and 1B.

On the other hand, in the wiring board 100 according to the present invention, as illustrated in FIGS. 2B and 3, the first solder resist layer 3a contains an insulating filler F with a diameter of about 1 to 10 micrometers which is made of a silicon oxide powder, for example.

Further, this insulating filler F has sunk below the upper surfaces of the strip-shaped wiring conductors 6 (toward the insulating layer 1b), as illustrated in FIG. 2B. Therefore, even when the solder resist layer 3a on the strip-shaped wiring conductors 6 has a thickness of 10 micrometers or less, namely a smaller thickness, external water and the like are prevented from reaching the strip-shaped wiring conductors 6 through the interfaces between the resin in the solder resist layer 3a and the insulating filler F contained in the solder resist layer 3a. This prevents the occurrence of corrosions and discolorations in the strip-shaped wiring conductors 6. This enables provision of the wiring board 100 with excellent electric connection reliability.

It is preferable that the upper surfaces of the strip-shaped wiring conductors 6 are rounded convex surfaces, as illustrated in FIG. 2B. This facilitates slip-down of the insulating filler F from the upper surfaces of the strip-shaped wiring conductors 6, which can effectively prevent the insulating filler F from remaining on the upper surfaces of the strip-shaped wiring conductors 6, when the insulating filler F contained in the solder resist layer 3a is sunk, as will be described later.

A method for forming the solder resist layer 3a in the wiring board 100 will be described, with reference to FIGS. 4A to 4F and FIGS. 5A to 5C.

Figure 4A:
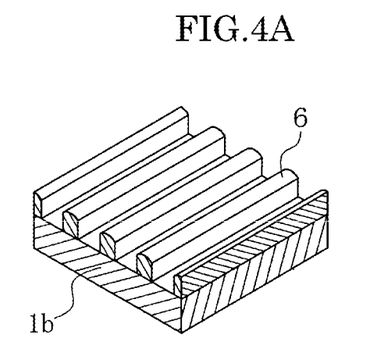
FIGS. 4A to 4F are schematic main-part enlarged perspective views of respective steps, for explaining a method for manufacturing the wiring board illustrated in FIGS. 1A and 1B.

At first, the strip-shaped wiring conductors 6 are formed on the upper surface of the insulating layer 1b, as illustrated in FIG. 4A. The strip-shaped wiring conductors 6 are formed through a well-known semi-additive method.

Figure 4B:
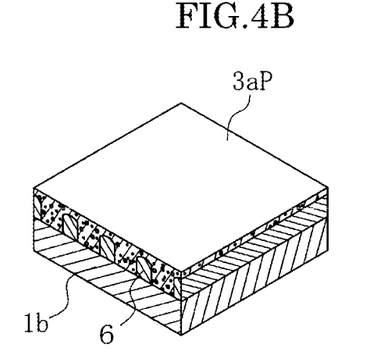
Figure 5A:
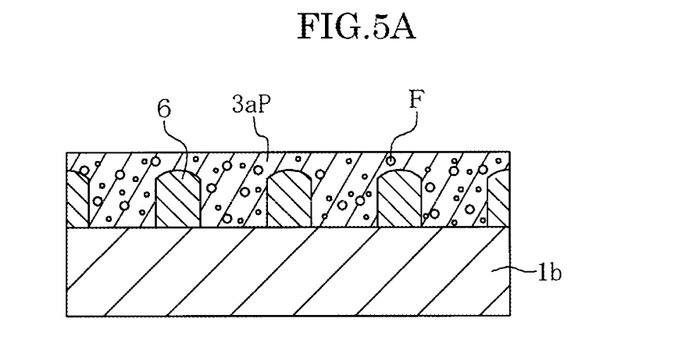
FIGS. 5A to 5C are schematic main-part enlarged cross-sectional views for explaining the method for manufacturing the wiring board illustrated in FIGS. 1A and 1B.

Next, as illustrated in FIG. 4B, a photosensitive resin paste 3aP for the solder resist layer 3a is overlaid on the insulating layer 1b and on the entire surfaces of the strip-shaped wiring conductors 6, so as to have such a thickness that the strip-shaped wiring conductors 6 are embedded in the photosensitive resin paste 3aP. It is preferable that the photosensitive resin paste 3aP has been diluted with a dilution agent to have a lower viscosity. Immediately after the photosensitive resin paste 3aP has been overlaid on the insulating layer 1b, the insulating filler F with diameters of about 1 to 10 micrometers which is made of a silicon oxide powder, for example, is dispersed substantially uniformly within the photosensitive resin paste 3aP, as illustrated in FIG. 5A.

Figure 4C:
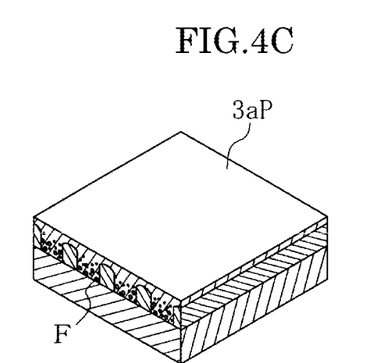
Figure 5B:
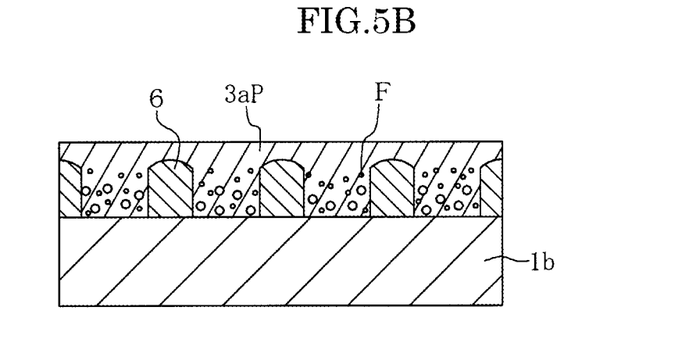

Next, the photosensitive resin paste 3aP having been overlaid thereon is let stand for a while, in order to cause the insulating filler F contained in the photosensitive resin paste 3aP to sink therein, as illustrated in FIG. 4C. At this time, when the upper surfaces of the strip-shaped wiring conductors 6 are rounded convex surfaces, as illustrated in FIG. 5B, the insulating filler F can easily slip down from the upper surfaces of the strip-shaped wiring conductors 6, which can effectively prevent the insulating filler F from remaining on the upper surfaces of the strip-shaped wiring conductors 6. In order to make the upper surfaces of the strip-shaped wiring conductors 6 be rounded convex surfaces, etching processing can be performed.

Figure 4D:
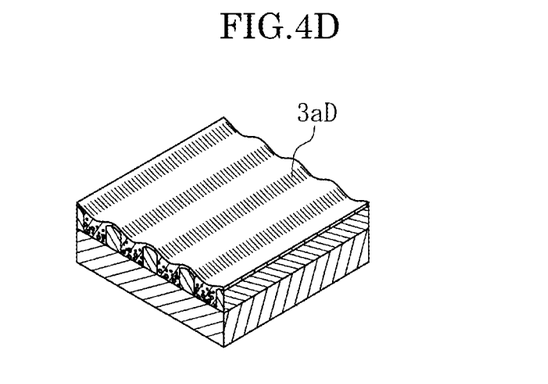
Figure 5C:
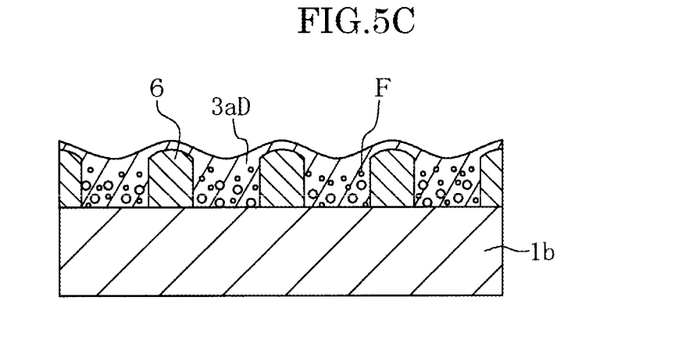

Next, as illustrated in FIG. 4D, the photosensitive resin paste 3aP having been overlaid thereon is dried to form a photosensitive resin layer 3aD, as illustrated in FIG. 4D. It is preferable to employ an oven at about 80 degrees C. for drying the photosensitive resin paste 3aP. The photosensitive resin layer 3aD having been dried thereby has a reduced volume, since agent ingredients have been vaporized therefrom. As a result thereof, as illustrated in FIG. 5C, the photosensitive resin layer 3aD is made to have a surface recessed in the thickwise direction, between the strip-shaped wiring conductors 6 adjacent to each other. These recesses are made deeper with increasing amount of the dilution agent used for diluting the photosensitive resin paste 3aP.

Figure 4E:
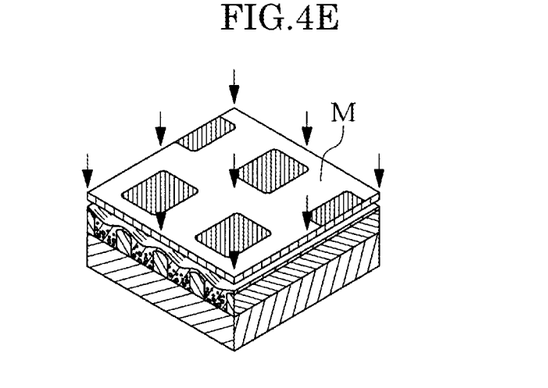

Next, as illustrated in FIG. 4E, a light-exposure mask M having a light-shield pattern is placed on the photosensitive resin layer 3aD, at the portions corresponding to the openings 9. Subsequently, an UV ray as exposure light is directed to the photosensitive resin layer 3aD from above the light-exposure mask M, in the direction of arrows illustrated in FIG. 4E, for performing light exposure thereon.

Figure 4F:
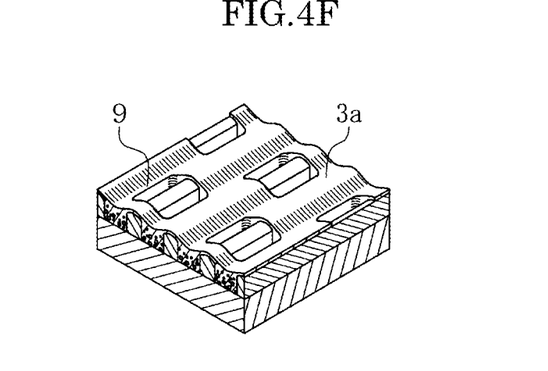

At last, as illustrated in FIG. 4F, the portions of the photosensitive resin layer 3aD which have not been subjected to the light exposure are removed, through development. The photosensitive resin layer 3aD which has been left is thermally cured, thereby forming the solder resist layer 3a.

According to the method for manufacturing the wiring board 100, the photosensitive resin paste 3aP for the solder resist 3a is overlaid on the insulating layer 1b as the outermost layer and on the entire surfaces of the strip-shaped wiring conductors 6, thereafter the insulating filler F in the photosensitive resin paste 3aP is sunk below the upper surfaces of the strip-shaped wiring conductors 6, thereafter the photosensitive resin paste 3aP is dried to form the photosensitive resin layer 3aD, and the photosensitive resin layer 3aD is subjected to light exposure and development processing to form the solder resist layer 3a having the openings 9 for individually exposing the semiconductor element connection pads 7. Thus, even when the solder resist layer 3a on the strip-shaped wiring conductors 6 has a thickness of 10 micrometers or less, namely a smaller thickness, external water and the like are prevented from reaching the strip-shaped wiring conductors 6 through the interfaces between the resin in the solder resist layer 3a and the insulating filler F contained in the solder resist layer 3a. This enables provision of the wiring board 100 with excellent electric connection reliability which is capable of preventing the occurrence of corrosions and discolorations in the strip-shaped wiring conductors 6.

The present invention is not limited to the embodiment, and various changes can be made thereto without departing from the spirit of the present invention.

Figure 6:
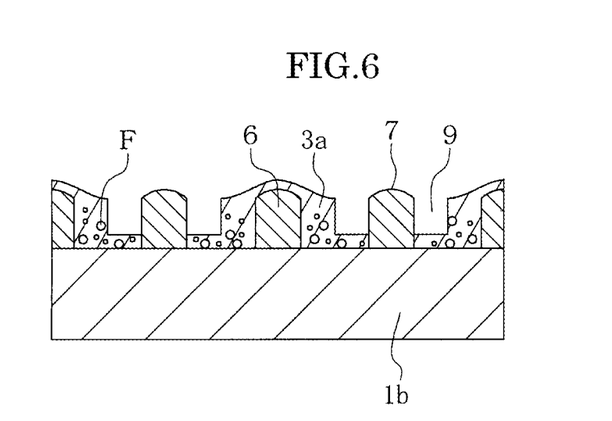
FIG. 6 is a main-part enlarged cross-sectional view of a wiring board according to another embodiment of the present invention.
Figure 7:
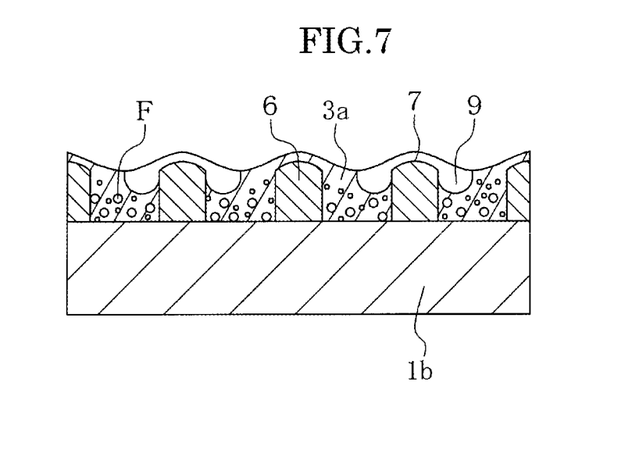
FIG. 7 is a main-part enlarged cross-sectional view of a wiring board according to yet another embodiment of the present invention.

For example, although, in the embodiment, the solder resist layer 3a is formed in such a way as to expose the insulating layer 1b through the bottom portions of the openings 9, the solder resist layer 3a may be also formed in such a way as to be overlaid on the insulating layer 1b within the openings 9 and, also, in such a way as to be recessed to a position lower than the upper surfaces of the semiconductor element connection pads 7 within the openings 9, as illustrated in FIG. 6. This allows the openings 9 to have a smaller depth. Therefore, in filling the gap between the lower surface of the semiconductor element S and the upper surface of the solder resist layer 3a with an under filling, it is possible to easily fill the openings 9 with the under filling. In order to cause the solder resist layer 3a to remain in such a way as to be overlaid on the insulating layer 1b within the openings 9 and, also, in such a way as to be recessed to a position lower than the upper surfaces of the semiconductor element connection pads 7 within the openings 9, it is possible to stop the development, halfway through the development processing described with reference to FIG. 4F, such that the portions of the photosensitive resin layer 3aD which have not been subjected to the light exposure are partially left on the insulating layer 1b, for example. At this time, by causing the developer to intrude into the openings 9 at a lower speed, it is possible to shape the solder resist layer 3a such that, within the openings 9, as shown in FIG. 7, the solder resist layer 3a has a cross-sectional shape which is recessed while being rounded around the opening edges 9a of the openings 9 and around the semiconductor element connection pads 7. This makes the openings 9 have a cross-sectional shape with rounded concave surfaces. As a result thereof, when the gap between the lower surface of the semiconductor element S and the upper surface of the solder resist layer 3a is filled with the under filling, it is possible to fill the openings 9 with the under filling more easily. Furthermore, it is possible to effectively prevent the formation of voids between the solder resist layer 3a and the under filling within the openings 9.

What is claimed is:

1. A wiring board comprising: an insulating board having an insulating layer as an outermost layer; a plurality of strip-shaped wiring conductors which are adhered on the insulating layer of the outermost layer, and are partially provided with semiconductor element connection pads to which electrode terminals of a semiconductor element are connected, and the semiconductor element connection pads being provided at positions which prevent the connection pads adjacent to each other from being laterally arranged; and a solder resist layer which is adhered on the insulating board and on the strip-shaped wiring conductors and has openings for individually exposing the semiconductor element connection pads such that each of the openings has opening edges which are positioned between the corresponding semiconductor element connection pad and the strip-shaped wiring conductors adjacent to this pad; wherein the solder resist layer internally contains an insulating filler, and the insulating filler is sunk below an upper surface of the strip-shaped wiring conductors, wherein the upper surface of the strip-shaped conductor wirings forms a rounded convex surface.

2. The wiring board according to claim 1, wherein the solder resist layer is formed in such a way as to expose the insulating layer through a bottom portion of the openings.

3. The wiring board according to claim 1, wherein the solder resist layer covers the insulating layer in the bottom portion of the openings and is recessed to a position lower than an upper surface of the semiconductor element connection pads within the openings.

4. The wiring board according to claim 3, wherein the solder resist layer is recessed such that, within the openings, the solder resist layer has a cross-sectional shape rounded around the opening edges and around the semiconductor element connection pads.

5. The wiring board according to claim 1, wherein the electrode terminals of the semiconductor element are connected to the semiconductor element connection pads, through flip-chip connection.

6. The wiring board according to claim 1, wherein the solder resist layer on the strip-shaped conductor wirings has a thickness of 10 micrometers of less.

7. The wiring board according to claim 1, wherein the insulating filler contained in the solder resist layer has a diameter of 1 to 10 micrometers.

8. The wiring board according to claim 1, wherein the semiconductor element connection pads are arranged in a zigzag manner.

9. A wiring board manufacturing method comprising the steps of: providing a plurality of strip-shaped wiring conductors which are partially provided with semiconductor element connection pads, on an insulating layer of an outermost layer in an insulating board, in such a way as to prevent the semiconductor element connection pads adjacent to each other from being laterally arranged; overlaying a photosensitive resin paste containing an insulating filler, on the insulating layer of the outermost layer and on a surface of the strip-shaped wiring conductors; causing the insulating filler in the photosensitive resin paste to sink below an upper surface of the strip-shaped wiring conductors; and drying the photosensitive resin paste and subsequently performing light exposure and development processing thereon to form a solder resist layer which has openings for individually exposing the semiconductor element connection pads, such that each of the openings has opening edges which are positioned between the corresponding semiconductor element connection pad and the strip-shaped wiring conductors adjacent to this pad, and forming the upper surface of the strip-shaped wiring conductors to form a rounded convex surface, by performing etching processing.

10. The wiring board manufacturing method according to claim 9, wherein
the development processing is performed on the solder resist layer, such that the insulating layer is exposed through a bottom portion of the openings.

11. The wiring board manufacturing method according to claim 9, wherein
the development processing is performed, such that the solder resist layer remains in such away as to be overlaid on the insulating layer within the openings and, also, in such a way as to be recessed to a position lower than an upper surface of the semiconductor element connection pads within the openings.

12. The wiring board manufacturing method according to claim 9, wherein
the development processing is performed such that, within the openings, the solder resist layer has a cross-sectional shape which is recessed while being rounded around the opening edges and around the semiconductor element connection pads.

13. The wiring board manufacturing method according to claim 9, wherein
the photosensitive resin paste has a reduced viscosity for facilitating sinking of the insulating filler.

14. The wiring board manufacturing method according to claim 9, wherein
the step of causing the insulating filler to sink below the strip-shaped wiring conductors includes a step of letting the photosensitive resin paste stand, after overlaying the photosensitive resin paste.

* * * * *